US010271051B2

United States Patent
Trinh et al.

(10) Patent No.: US 10,271,051 B2
(45) Date of Patent: Apr. 23, 2019

(54) METHOD OF CODING A REAL SIGNAL INTO A QUANTIZED SIGNAL

(71) Applicant: COMMISSARIAT A L'ENERGIE ATOMIQUE ET AUX ENERGIES ALTERNATIVES, Paris (FR)

(72) Inventors: Hong-Phuc Trinh, Massy (FR); Marc Duranton, Orsay (FR); Michel Paindavoine, Plombières les Dijon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 19 days.

(21) Appl. No.: 15/515,843

(22) PCT Filed: Sep. 24, 2015

(86) PCT No.: PCT/EP2015/071939
§ 371 (c)(1),
(2) Date: Mar. 30, 2017

(87) PCT Pub. No.: WO2016/050595
PCT Pub. Date: Apr. 7, 2016

(65) Prior Publication Data
US 2017/0302933 A1 Oct. 19, 2017

(30) Foreign Application Priority Data

Oct. 3, 2014 (FR) .................. 14 59470

(51) Int. Cl.
*H04N 19/00* (2014.01)
*H04N 19/124* (2014.01)
(Continued)

(52) U.S. Cl.
CPC ..... *H04N 19/124* (2014.11); *G06F 17/30324* (2013.01); *G06T 9/002* (2013.01);
(Continued)

(58) Field of Classification Search
CPC .. H04N 19/124; H04N 19/126; H04N 19/132; G06F 17/30324; G06T 9/002; H03M 7/3082
See application file for complete search history.

(56) References Cited

U.S. PATENT DOCUMENTS

| 5,740,326 A * | 4/1998 | Boulet ............... G06F 7/544 382/158 |
| 6,301,572 B1 * | 10/2001 | Harrison ............ G01H 1/00 702/185 |

(Continued)

OTHER PUBLICATIONS

Nadia Nedjah, Rodrigo Martins da Silva, Luiza de Macedo Mourelle, "Compact yet efficient hardware implementation of artificial neural networks with customized topology", Expert Systems with Applications, vol. 39, Issue 10, 2012, pp. 9191-9206, (Year : 2012).*

(Continued)

*Primary Examiner* — Utpal D Shah
(74) *Attorney, Agent, or Firm* — Baker & Hostetler LLP

(57) ABSTRACT

A method implemented by a processor for coding a real signal, for example an image signal, into a quantized signal, comprises the following steps applied to each real sample of the real signal: converting the real sample into a digital representation, selecting, in the fractional part of the number, a predetermined number N of most significant non-zero bits, for each non-zero significant bit i selected, i varying from 1 to N, determining its distance $P_i$ with respect to the neighboring selected non-zero significant bit of higher rank or, for the first non-zero significant bit selected, with respect to the decimal point, deducting from the distance $P_i$ the minimum value of distance between two non-zero bits, coding the modified distance $P_i$ on a predetermined number $M_i$ of bits.

17 Claims, 3 Drawing Sheets

(51) Int. Cl.
*G06T 9/00* (2006.01)
*H04N 19/126* (2014.01)
*H03M 7/30* (2006.01)
*H04N 19/132* (2014.01)
*G06F 17/30* (2006.01)

(52) U.S. Cl.
CPC ........ *H03M 7/3082* (2013.01); *H04N 19/126* (2014.11); *H04N 19/132* (2014.11)

(56) References Cited

U.S. PATENT DOCUMENTS 6,496,815 B1* 12/2002 Kawashima ........... G06N 3/049
332/106
2012/0002895 A1 1/2012 Blum et al.

OTHER PUBLICATIONS

Miroslav Skrbek, "Fast neural network implementation," Neural Network World, vol. 9, No. 5, 1999, pp. 375-391.
Uros Lotric et al., "Applicability of approximate multipliers in hardware neural networks," Neurocomputing, vol. 96, 2012, pp. 57-65.
Jeffrey Coleman et al., "Fractions in the canonical-signed-digit number system," 2001 Conference on Information Sciences and Systems, Mar. 21-23, 2001.
Vincent Vanhoucke et al., "Improving the speed of neural networks on CPUs," Dec. 17, 2011, XP055175306.
Jiang et al., "The Effects of Quantization on Multi-Layer Feedforward Neural Networks," International Journal of Patter Recognition and Artificial Intelligence, vol. 17, No. 4, Jun. 1, 2003, pp. 637-661, XP001171799.

* cited by examiner

METHOD OF CODING A REAL SIGNAL INTO A QUANTIZED SIGNAL

CROSS-REFERENCE TO RELATED APPLICATIONS

This application is a National Stage of International patent application PCT/EP2015/071939, filed on Sep. 24, 2015, which claims priority to foreign French patent application No. FR 1459470, filed on Oct. 3, 2014, the disclosures of which are incorporated by reference in their entirety.

FIELD OF THE INVENTION

The invention relates to the field of applications of signal processing and data processing, implemented by software and/or hardware processors with limited calculation resources. The invention relates to all signal processing applications which require the execution of multiplication, addition or convolution operations. In particular, the invention envisages real-time applications which require the execution of a large number of operations in a limited time.

The invention pertains more precisely to a method of coding a signal represented in real notation into a quantized signal whose samples are represented in fixed-point notation so as to limit the calculational cost to be performed on these numbers as well as the memory space needed to store them.

The invention applies especially to applications in image processing, video processing and in particular to so-called neural network algorithms which require a large storage capacity to save the synaptic weights and a large number of operations, in particular of convolutions.

BACKGROUND

Neural networks are for example used in the fields of image recognition or classification, for example for signposts, for the indexing of large image databases, for the recognition of post codes on an envelope or more generally for the recognition of alphanumeric characters.

But the invention also applies to any other application which requires the use of a processor and of a storage memory in order to carry out operations on digitally sampled signals. The envisaged signals can be image, video, audio signals, and also radiofrequency signals.

The problem envisaged by the invention consists in quantizing a real signal on the lowest possible number of bits so as to limit the resources needed to store the signal samples and carry out the mathematical operations needed for the envisaged processings with the simplest possible embodiment in regard to hardware. In particular, the invention is aimed at allowing a simplification in the structure for multiplying two real numbers.

But the quantization of the signal must also make it possible not to degrade the performance and the precision of the processings applied to the signals.

The literature in the field of neural networks comprises teachings relating to the possible solutions for reducing the complexity of the processings carried out within the framework of applications of this type.

Reference [1] presents an optimization of the multiplication operations and other nonlinear operations used in the processings executed by neural networks. The envisaged optimization consists in performing a linear approximation of an integer number. For example the number $2^x$ is approximated by $2^{int(x)}(1+\text{frac}(x))$, where $int(x)$ designates the integer part of the real number x and $\text{frac}(x)$ designates its fractional part. The implementation of a multiplication of two numbers approximated by this representation requires only the use of shift registers and adders. However, the multiplication operation remains complex to implement.

Reference [2] proposes to use an approximate representation of the exact multiplication operation by introducing an iterative logarithmic multiplier. However, the number of bits used to quantize the real numbers is not optimized.

The invention proposes to solve the limitations of the prior art solutions by proposing a procedure for quantizing a real signal which uses a particular approximation and which makes it possible to simplify the implementation of the operation of multiplying two real numbers.

SUMMARY OF THE INVENTION

The subject of the invention is thus a method, implemented by a processor, of coding a real signal, for example an image signal, into a quantized signal, said method comprising the following steps applied to each real sample of said real signal:

converting the real sample into a digital representation as a binarized sample comprising a fractional part selecting, in the fractional part of the number, a predetermined number N of most significant non-zero bits, for each non-zero significant bit i selected, i varying from 1 to N, determining its distance $P_i$ with respect to the neighboring selected non-zero significant bit of higher rank or, for the first non-zero significant bit selected, with respect to the decimal point, deducting from said distance $P_i$ the smallest possible value of distance between two non-zero bits in an arbitrary binarized number converted into said digital representation coding the modified distance $P_i$ on a predetermined number $M_i$ of bits.

According to a particular aspect, the method of coding a real signal into a quantized signal according to the invention comprises a prior step of transforming the real sample into a real number lying strictly between −1 and 1.

According to a particular aspect of the invention, the digital representation is a binary representation or a balanced ternary representation in which a +/− sign is associated with each bit, said sign being coded by a bit in the quantized signal. For these representations, the minimum value of distance between two non-zero bits is equal to one.

According to another particular aspect of the invention, the digital representation is a canonical signed binary representation which satisfies the following properties:

two consecutive bits of the canonical signed binary representation of a number are never simultaneously non-zero, the canonical signed binary representation of a number is unique, the canonical signed binary representation of a number comprises a minimum number of non-zero bits.

For a canonical signed binary representation, the minimum value of distance between two non-zero bits is equal to two.

According to a particular aspect, the method of coding a real signal into a quantized signal according to the invention furthermore comprises the following steps (105):

decomposing the value of the modified distance into a sum of $2^{M_i}-1$ and of a residual value $P'_{i+1}$ if the modified distance $P_i$, associated with the non-zero significant bit of index i, exhibits a value greater than or equal to $2^{M_i}-1$, where $M_i$ is the number of bits chosen to code the modified distance $P_i$, coding the term $2^{M_i}-1$ on the number of bits $M_i$ chosen to code the modified distance $P_i$, performing the following substitutions: $P_N=P_{N-1}, \ldots, P_{i+2}=P_{i+1}, P_{i+1}=P^{i+1}$ According to a particular aspect of the invention, the signal is an image signal or a signal composed of synaptic weights of a neural network.

The subject of the invention is also a device for coding a real signal, for example a video signal, into a quantized signal, comprising a module configured to execute the method according to the invention and a computer program comprising instructions for the execution of the method of coding a real signal, for example a video signal, into a quantized signal, according to the invention, when the program is executed by a processor.

The subject of the invention is also a multiplier circuit configured to calculate the result of multiplying a first number by a second number, both of which are quantized by applying the method of coding according to the invention with a number N, equal to two, of distances, said circuit comprising an adder designed to add together the first distance of the first quantized number and the first distance of the second quantized number, a correspondence table indexed at least by the values of the second distance of the first quantized number and of the second distance of the second quantized number and a shift register configured to carry out a binary shift on the output of the correspondence table of a number of bits equal to the output of the adder.

According to a particular aspect of the multiplier circuit according to the invention, the correspondence table is furthermore indexed by the sign of the second distance of the first quantized number and the sign of the second distance of the second quantized number, said multiplier circuit furthermore comprising an exclusive OR logic gate receiving as input the sign of the first distance of the first quantized number and the sign of the first distance of the second quantized number.

The subject of the invention is further a convolution circuit configured to calculate the result of convolving a first vector of numbers and a second vector of numbers quantized by applying the method of coding according to the invention, said convolution circuit comprising a multiplier circuit according to the invention and an accumulator configured to accumulate the output values of the multiplier circuit.

BRIEF DESCRIPTION OF THE DRAWINGS

Other characteristics and advantages of the present invention will become better apparent on reading the description which follows in relation to the appended drawings which represent.

DETAILED DESCRIPTION

Figure 1:
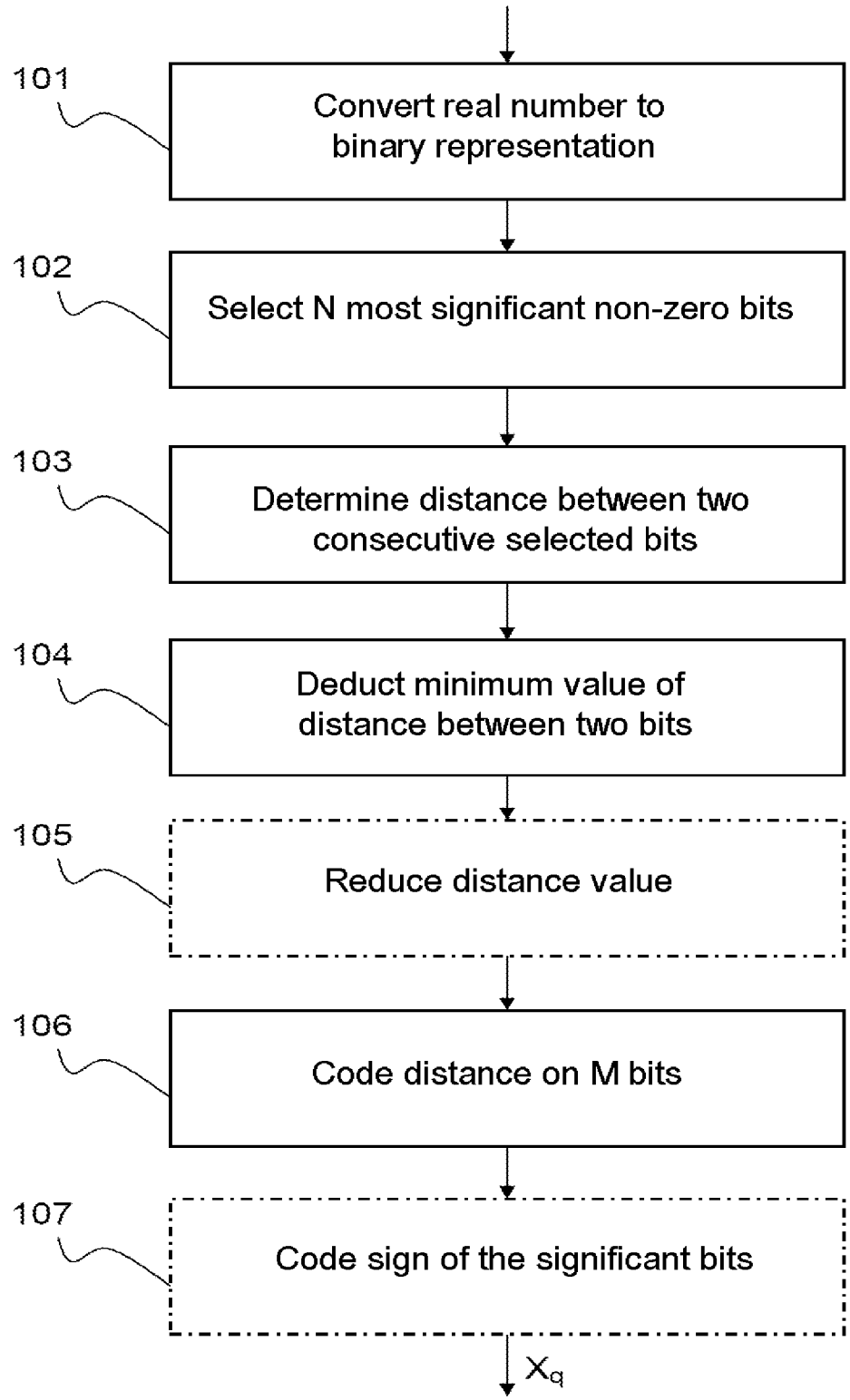
FIG. 1, a flowchart illustrating the steps of implementing the method of coding according to the invention FIG. 2, an illustrative example of applying the method to a real number in binary representation FIG. 3, an illustrative example of applying the method to a real number in canonical signed binary representation, FIG. 4, a diagram of a convolution circuit suitable for carrying out the convolution of quantized numbers according to the invention.

FIG. 1 describes the steps of implementing the quantization method according to the invention which is aimed at coding a real number $X_f$ into a quantized number $X_q$ with a limited number of bits. It is assumed that the real number $X_f$ lies strictly between $-1$ and $1$, stated otherwise that the integer part of the number is zero. If the number to be coded does not satisfy this property, a conversion of the number into the interval $]-1; 1[$ is carried out beforehand. This operation can be simply performed by shifting the position of the decimal point toward the left until a number lying in the interval $]-1; 1[$ is obtained.

Figure 2:
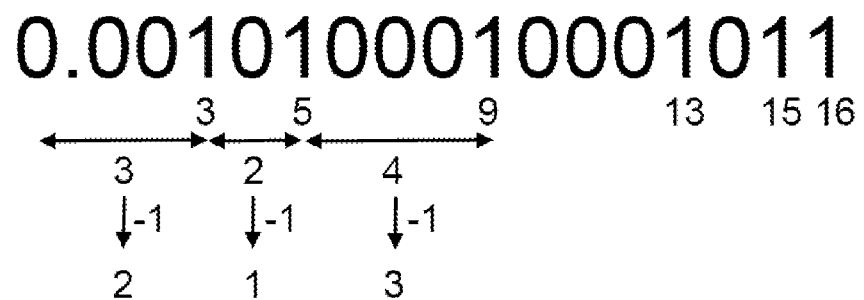

In a first step 101, the real number $X_f$ to be coded is transformed into a binary representation. In a first embodiment of the invention, a binary representation is chosen, stated otherwise a representation to base two. FIG. 2 represents by way of illustration the binary value of the real number 0.158370972 quantized on 16 bits.

In a second step 102, the N most significant non-zero bits are selected from the fractional part of the binary representation of the number, and their position is retained. In the example of FIG. 2, N is chosen equal to 3, the number is then truncated, preserving only the three most significant 1-bits, thereby giving the binary value 0.001010001. The positions of these three bits with respect to the decimal point are given by the triplet $\{3; 5; 9\}$.

In a third step 103, the distance between two successive positions is then calculated. In the example of FIG. 2, the distance between the decimal point and the first non-zero bit is equal to $3-0=3$, the distance between the first non-zero bit and the second non-zero bit is equal to $5-3=2$, the distance between the second non-zero bit and the third non-zero bit is equal to $9-5=4$. The triplet of distances $\{3; 2; 4\}$ is therefore obtained.

In a fourth step 104, the minimum distance between two consecutive bits which equals 1 in the case of a binary representation is deducted from each distance. Indeed, the distance between two bits always being at least equal to 1, it is possible to deduct this value from the calculated distances. The objective of this step is to limit as far as possible the values of distances to small numbers, doing so in order to limit the number of bits needed to code them. After step 104, the triplet of modified distances is equal to $\{2; 1; 3\}$.

In an additional step 106, the modified distances obtained are coded on M bits, M being chosen equal to the maximum value which makes it possible to code the modified distances obtained. In the example of FIG. 2, M is equal to two bits and the quantized number obtained by the method according to the invention is given by the triplet $\{10; 01; 11\}$.

It should be noted, however, that the number M chosen may be different for each distance.

More generally, the correspondence between a real number $X_f$ and its quantized version obtained by applying the method according to the invention $X_q=\{P_1; P_2; \ldots ; P_N\}$ is given by the following relation:

$$Xq=\{P_1;P_2;\ldots;P_N\}\sim Xf=\Sigma_{i=1}{}^N 2^{-(\Sigma_{j=1}{}^i Pj+i)} \quad (1)$$

Relation (1) makes it possible to decode the quantized number $X_q$ so as to retrieve the corresponding real number $X_f$.

One of the advantages of the method according to the invention resides in the low values of the distances obtained on completion of step 104 and which can thus be coded on a reduced number of bits. In the example given in FIG. 2, the distances obtained are at most equal to three, thereby allowing coding on two bits.

However, a problem arises if one or more distances exhibit a value which exceeds the maximum admissible value for coding on M bits, stated otherwise which exceeds the value $2^M-1$.

To solve this problem, an optional additional step 105 can be added to the method before quantization of the distances.

An exemplary problematic case corresponds to the number 0.0100000101010011 in binary representation which can be coded by the distances {1; 5; 1}. The distance 5 cannot be coded on two bits. To alleviate this problem, the values which exceed the maximum value $2^M-1$, with M the number of bits chosen for the distance to be coded, are decomposed into a sum of values that are smaller than this maximum value. In the example hereinabove, the distance 5 can be decomposed into a sum 5=3+2.

By this process, a distance having a high value is decomposed into several sub-distances that are coded individually.

The notion of inactive distance and of active distance is then introduced. A distance is said to be inactive if its value is equal to $2^M-1$ in real notation or if all its bits are equal to 1 in binary notation. If this is the case, when decoding the quantized number, this distance is saved and added to the following distance. This action is iterated until the reading of an active distance whose value is strictly less than $2^M-1$.

In the aforementioned example, the quantized number obtained is given by the triplet {01; 11; 10} which corresponds in terms of real values to the distances {1; 3; 2} and by summing the inactive distance 3 and the following active distance 2, the doublet of distances {1;5} is obtained, which represents the number 0.01000001. In the previous example the number M of bits chosen to code each distance is the same but it may also be taken equal to a different value for each distance.

More generally, the coding process can be described in the following manner.

Let $\{M_1; \ldots; M_N\}$ be the numbers of bits chosen to code respectively the distances $\{P_1; P_2; \ldots; P_N\}$. If a distance $P_i$ has a value which exceeds the maximum value $2^{M_i}-1$, then it is decomposed into $P_i=P'_i+P'_{i+1}$, with $P'_i=2^{M_i}-1$ which is coded as inactive distance. The following substitutions $P_N=P_{N-1}, \ldots, P_{i+2}=P_{i+1}, P_{i+1}=P'_{i+1}$ are carried out thereafter, and then the coding process is continued with the following distance $P_{i+1}$ which is the following distance which is coded with $M_{i+1}$ bits.

Relation (1) is then modified into the following relation (2):

$$Xq=\{P_1;P_2;\ldots;P_N\}\sim Xf=\Sigma_{i=1}^N A_i \cdot 2^{-\Sigma_{j=1}^i(P_j+A_j)} \quad (2)$$

Ai defines whether the distance i is active: if all the bits of the distance Pi equal 1, Ai=0, otherwise, Ai=1. When Ai=1, the sign of Si before each position indicates whether the power of 2 of this position is added to or subtracted from the final value.

Ai represents the distance factor and equals 1 for an active distance and 0 for an inactive distance.

Relation (2) makes it possible to decode the quantized number $X_q$ so as to retrieve the corresponding real number $X_f$.

An additional problem arises when the method of coding, such as described hereinabove, according to the invention is applied to a number whose binary representation comprises a large number of consecutive 1 s in its fractional part. For example, the number 0.0111101110111011 is approximated by 0.0111 if only N=3 significant non-zero bits are selected. It is seen that in this example, the quantization error is considerable.

A solution for limiting the quantization error consists in using a ternary representation (−1, 0, 1), known mathematically speaking as a balanced ternary representation, rather than using a binary representation. Indeed, by using, as well as addition, the operation of subtraction, the number 0.0111101110111011 can be approximated by the signed sum of the following three powers of two: $2^1-2^{-6}-2^{-10}$. Using this approximation, the resulting quantization error is not as considerable as in the case of the binary representation: $2^{-2}+2^{-3}+2^{-4}$.

When a balanced ternary representation is used, it is necessary, as well as coding the distances between significant non-zero bits, to code the sign associated with each non-zero bit. Thus, in an ultimate step 107, this sign is coded on one bit.

The correspondence relation (2) then becomes:

$$Xq=\{S_1P_1;S_2P_2;\ldots;S_NP_N\}\sim Xf=\Sigma_{i=1}^N A_i \cdot (-1)^{S_i} \cdot 2^{-(\Sigma_{j=1}^i(P_j+A_j))} \quad (3)$$

$S_i$ is the coded value of the sign which equals 0 if the sign of the $i^{th}$ position of the non-zero bit in the balanced ternary decomposition is positive and 1 if this sign is negative.

The use of a balanced ternary representation presents, however, the drawback of an absence of uniqueness of this representation. Stated otherwise, one and the same number can have several balanced ternary representations. This absence of uniqueness poses a problem insofar as certain occurrences of this representation may give rise to an even more considerable quantization error than for a binary representation.

For this reason, and according to a second embodiment, the method according to the invention can also be applied to a signed canonical binary representation or "Canonical Signed Digit" CSD.

This representation is introduced in reference [3]. It uses a system of ternary numbers {1',0,1} where 1' represents the value −1. The CSD representation consists of a sum of signed powers of two just like the signed base two representation. It possesses, however, the following properties which differentiates it from the signed base two representation:

two consecutive bits cannot be non-zero,
the CSD representation is unique,
the CSD representation comprises a minimum number of non-zero bits.

Thus, in the CSD representation of a number, only one third of the bits are non-zero on average as against a half in a conventional binary representation.

This property of the CSD representation is advantageous for the invention since an objective of the envisaged method of coding is to code the distances between non-zero bits. The lower the number of non-zero bits, the more this means that the precision of the quantized number will be considerable since the number of truncated non-zero bits will be limited.

Figure 3:
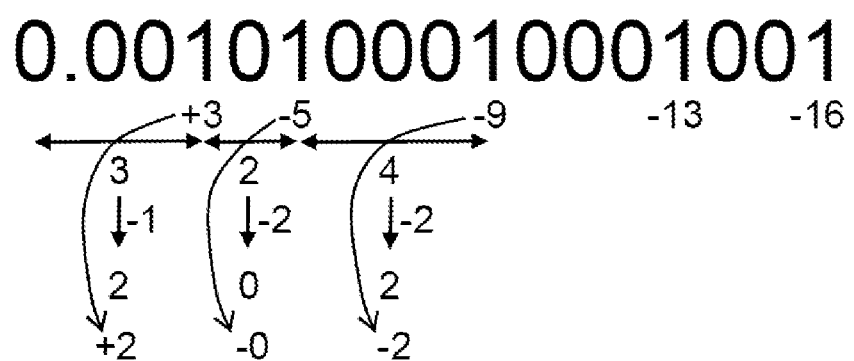

FIG. 3 gives by way of illustration the CSD representation of the number 0.091903687. This binary representation comprises five non-zero bits in the positions {3; 5; 9; 13; 16} and the signs associated with these bits are {+; −; −; +; −}.

The method according to the invention is applied to this CSD binary representation in the same manner as that described in FIG. 1. The only difference resides in the fact that the minimum distance between two non-zero bits, in a CSD representation, is equal to two rather than to one. In step 104 of the method, the value 2 is then deducted from each calculated distance, instead of the value 1 in the case of the binary representation.

Returning to the aforementioned example, the three most significant non-zero bits and their positions {3; 5; 9} are retained, together with their signs {+; −; −}. The distances between two consecutive significant non-zero bits {3−0; 5−3; 9−5}={3; 2; 4} are then calculated. The minimum distance, equal to 2, is thereafter deducted from these values to obtain the triplet {1; 0; 2}. Appending the signs, one arrives at the result {+1; −0; −2}.

The correspondence relation (3) is modified in the case of a signed canonical binary representation into the following relation (4):

$$Xq=\{S_1P_1;S_2P_2;\ldots;S_NP_N\}\sim Xf=\Sigma_{i=1}^{N}Ai.(-1)^{if}.2^{1-(\Sigma_{j=1}^{i}(Pj+2Aj))} \quad (4)$$

The method according to the invention can be implemented on the basis of hardware and/or software elements. It can in particular be implemented in the guise of computer program comprising instructions for its execution. The computer program can be recorded on a recording medium readable by a processor.

The method according to the invention can be executed by a processor which can be a generic processor, a specific processor, an Application Specific Integrated Circuit (ASIC) or a Field-Programmable Gate Array (FPGA).

Figure 4:
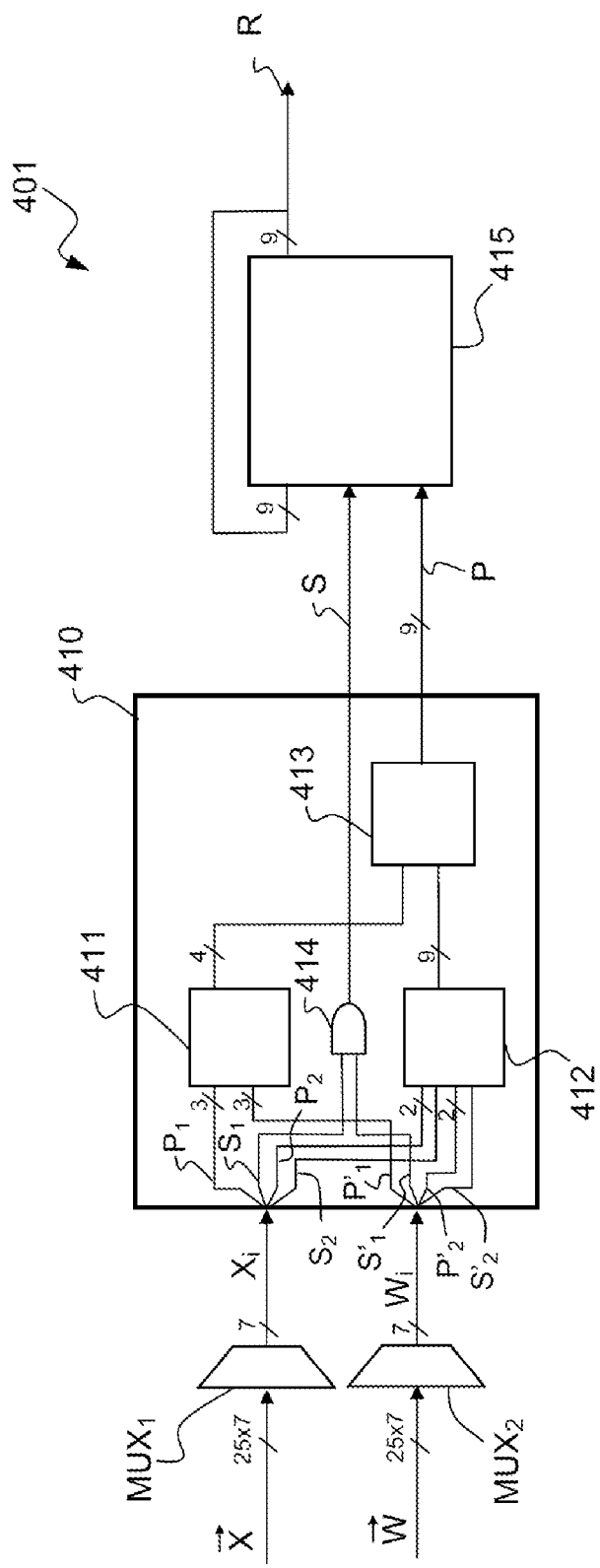

FIG. 4 describes a convolution module 401 for convolving two vectors of integer numbers quantized by applying the method according to the invention.

The module 401 is described in the form of an integrated circuit of ASIC type but it can also be implemented by a circuit of the FPGA type or via any other suitable implementation.

The module 401 is configured to carry out the convolution of a first vector X comprising, for example, 25 quantized samples $x_i$ and of a second vector W also comprising, for example, 25 quantized samples $w_i$.

The samples $x_i$ of the first vector are quantized by two distances P1,P2 coded respectively on 3 and 2 bits and their associated signs S1,S2.

The samples wi of the second vector are quantized with the same parameters, stated otherwise by two distances P'1,P'2 also coded respectively on 3 and 2 bits and their associated signs S'1,S'2.

Each sample is therefore quantized on 7 bits in total corresponding to 3 bits for the first distance, 2 bits for the second distance and 1 bit for each of the two signs.

The 25 samples of each vector are produced at the input of two multiplexers MUX1,MUX2.

The convolution module 401 also comprises a first multiplication sub-module 410 or multiplier and a second accumulation sub-module 415, or accumulator, for the outputs of the multiplier 410.

The multiplier 410 carries out the multiplication of two numbers $x_i,w_i$. This multiplication can be decomposed in the following manner:

$$x_i * w_i = \{(-1)^{S_1}2^{-(P_1+1)} + (-1)^{S_2}2^{-(P_1+P_2 30\ 3)}\} *$$
$$\{(-1)^{S'_1}2^{-(P'_1+1)} + (-1)^{S'_2}2^{-(P'_1+P'_2+3)}\} x_i *$$
$$w_i = (-1)^{S_1}2^{-(P_1+1)}\{1+(-1)^{S_2}2^{-(P_2+2)}\} *$$
$$(-1)^{S'_1}2^{-(P'_1+1)}\{1+(-1)^{S'_2}2^{-(P'_2+2)}\} x_i *$$
$$w_i = (-1)^{S_1+S'_1}2^{-(P_1+P'_1+2)}\Gamma(S_2,P_2,S'_2,P'_2) \quad (5)$$

Relation (5) makes it possible to optimize the implementation of the multiplier 410 which is thus composed:

- of an adder 411 which carries out the addition on 3 bits of the distances $P_1$ and $P'_1$,
- of a table 412 which stores the values of the function $\Gamma(S_2, P_2, S'_2, P'_2)$ and whose inputs are the numbers $S_2$, $P_2$, $S'_2$, $P'_2$.
- of an exclusive OR logic gate 414 which delivers the sign of the product $x_i * w_i$ given by the value $(-1)^{S_1+S'_1}$

- of a shift register 413 for carrying out the operation $2^{-(P_1+P'_1+2)}$

The multiplier 410 delivers the sign S and the value P of the product which are thereafter provided as input to the accumulator 415 which sums the 25 products so as to produce the result R of the convolution.

An advantage of the convolution module 401 and in particular of the multiplier 410 is its simplicity of implementation by virtue of the particular quantization carried out according to the invention on the inputs.

The module 401 allows a significant gain in terms of power consumed and area required and also in terms of maximum operating frequency as compared with a convolution module embodied with a conventional quantization of the data on 7 bits.

Thus, the convolution module 401 according to the invention can be advantageously used for any data processing or signal processing application which makes it necessary to perform multiplications or convolutions at a considerable pace. In particular, this module can be used by a neural network to calculate the new state of a neuron by calculating the weighted sum of the inputs by the synaptic weights.

The quantization parameters of the data can be determined by optimization, for example by simulating the performance of the envisaged application by varying the number of quantization bits and/or the number of distances preserved to code a real number.

In the case of a neural network used for a character recognition application, the quantization parameters can be determined by observing the percentage of poor classifications as a function of the parameters used and by preserving the parameters which offer the best compromise between number of quantization bits used and precision required in the data in order to preserve acceptable performance for the application. The results of simulations show a genuine advantage in terms of memory size for storing the synaptic coefficients and input data of the type of coding proposed with respect to a binary coding for results with similar precision.

REFERENCES

[1] "Fast neural network implementation", Skrbek, M., Neural Network World, 9(5), 375-391, 1999

[2] "Applicability of approximate multipliers in hardware neural networks", Lotric, U., Bulic, P., Neurocomputing, 96, 57-65, 2012

[3] "Fractions in the canonical-signed-digit number system", J. O. Coleman and A.Yurdakul, 2001, In Conf. on information sciences and systems.

The invention claimed is:

1. A computer-implemented method for coding a real signal, for example an image signal, into a quantized signal, said method comprising the following steps applied to each real sample of said real signal:
   converting, with a processor, the real sample into a binarized sample comprising a fractional part that comprises a digital representation,
   selecting, with the processor, in the fractional part of the binarized sample, a predetermined number N of most significant non-zero bits,
   for each non-zero significant bit i selected, i varying from 1 to N, determining, with the processor, its distance $P_i$ to a neighboring selected non-zero significant bit of higher rank or, for a first non-zero significant bit selected, to a decimal point, subtracting, with a processor, from said distance $P_i$ a minimum value of distance between two non-zero bits in any binarized number converted from any real number according to said digital representation, to obtain a modified distance, coding, with a processor, the modified distance $P_i$ on a predetermined number $M_i$ of bits.

2. The method for coding a real signal into a quantized signal of claim 1, comprising a prior step of transforming the real sample into a real number lying strictly between −1 and 1.

3. The method for coding a real signal into a quantized signal of claim 1, wherein the digital representation is a binary representation.

4. The method for coding a real signal into a quantized signal of claim 1, wherein the digital representation is a balanced ternary representation in which a +/− sign is associated with each bit of the binarized number, said sign being coded by an additional bit in the quantized signal.

5. The method for coding a real signal into a quantized signal of claim 3, wherein the minimum value of distance between two non-zero bits is equal to one.

6. The method for coding a real signal into a quantized signal of claim 1, wherein the digital representation is a canonical signed binary representation which satisfies the following properties:
   two consecutive bits of the canonical signed binary representation of a number are never simultaneously non-zero,
   the canonical signed binary representation of a number is unique,
   the canonical signed binary representation of a number comprises a minimum number of non-zero bits.

7. The method for coding a real signal into a quantized signal of claim 6, wherein the minimum value of distance between two non-zero bits is equal to two.

8. The method for coding a real signal into a quantized signal of claim 1, further comprising the steps of:
   decomposing the value of the modified distance into a sum of $2^{M_i}-1$ and of a residual value $P'_{i+1}$ if the modified distance $P_i$, associated with the non-zero significant bit of index i, has a value greater than or equal to $2^{M_i}-1$, where $M_i$ is the number of bits chosen to code the modified distance $P_i$,
   coding the term $2^{M_i}-1$ on the number of bits $M_i$ chosen to code the modified distance $P_i$,
   performing the following substitutions: $P_N=P_{N-1}, \ldots, P_{i+2}=P_{i+1}, P_{i+1}=P'_{i+1}$.

9. The method for coding a real signal into a quantized signal according to claim 1, wherein the real signal is an image signal or a signal composed of synaptic weights of a neural network.

10. A device for coding a real signal, for example a video signal, into a quantized signal, comprising a calculator configured to execute a computer-implemented method for coding a real signal, for example an image signal, into a quantized signal, said method comprising the following steps applied to each real sample of said real signal:
   converting the real sample into a binarized sample comprising a fractional part that comprises a digital representation,
   selecting, in the fractional part of the binarized sample, a predetermined number N of most significant non-zero bits,
   for each non-zero significant bit i selected, i varying from 1 to N, determining its distance $P_i$ to a neighboring selected non-zero significant bit of higher rank or, for a first non-zero significant bit selected, to a decimal point,
   subtracting from said distance $P_i$ a minimum value of distance between two non-zero bits in any binarized number converted from any real number according to said digital representation, to obtain a modified distance,
   coding the modified distance $P_i$ on a predetermined number $M_i$ of bits.

11. A computer program comprising instructions stored on a tangible non-transitory storage medium for executing on a processor a computer-implemented method for coding a real signal, for example an image signal, into a quantized signal, said method comprising the following steps applied to each real sample of said real signal:
   converting the real sample into a binarized sample comprising a fractional part that comprises a digital representation,
   selecting, in the fractional part of the binarized sample, a predetermined number N of most significant non-zero bits,
   for each non-zero significant bit i selected, i varying from 1 to N, determining its distance $P_i$ to a neighboring selected non-zero significant bit of higher rank or, for a first non-zero significant bit selected, to a decimal point,
   subtracting from said distance $P_i$ a minimum value of distance between two non-zero bits in any binarized number converted from any real number according to said digital representation, to obtain a modified distance,
   coding the modified distance $P_i$ on a predetermined number $M_i$ of bits.

12. A multiplier circuit configured to calculate the result of multiplying a first number $x_i$ by a second number $w_i$, both of which are quantized by applying a computer-implemented method for coding a real signal, for example an image signal, into a quantized signal, said method comprising the following steps applied to each real sample of said real signal:
   converting the real sample into a binarized sample comprising a fractional part that comprises a digital representation,
   selecting, in the fractional part of the binarized sample, a predetermined number N of most significant non-zero bits,
   for each non-zero significant bit i selected, i varying from 1 to N, determining its distance $P_i$ to a neighboring selected non-zero significant bit of higher rank or, for a first non-zero significant bit selected, to a decimal point,
   subtracting from said distance $P_i$ a minimum value of distance between two non-zero bits in any binarized number converted from any real number according to said digital representation, to obtain a modified distance,
   coding the modified distance $P_i$ on a predetermined number $M_i$ of bits with a number N, equal to two, of distances, said circuit comprising an adder designed to add together the first distance of the first quantized number $x_i$ and the first distance of the second quantized number $w_i$, a correspondence table indexed at least by the values of the second distance of the first quantized number $x_i$ and of the second distance of the second quantized number $w_i$ and a shift register configured to carry out a binary shift on the output of the correspondence table of a number of bits equal to the output of the adder.

13. The multiplier circuit of claim 12, wherein the correspondence table is furthermore indexed by the sign of the second distance of the first quantized number xi and the sign of the second distance of the second quantized number wi, said multiplier circuit furthermore comprising an exclusive OR logic gate receiving as input the sign of the first distance of the first quantized number xi and the sign of the first distance of the second quantized number wi.

14. A convolution circuit configured to calculate the result of convolving a first vector of numbers $x_i$ and a second vector of numbers $w_i$ quantized by applying a computer-implemented method for coding a real signal, for example an image signal, into a quantized signal, said method comprising the following steps applied to each real sample of said real signal:

converting the real sample into a binarized sample comprising a fractional part that comprises a digital representation, selecting, in the fractional part of the binarized sample, a predetermined number N of most significant non-zero bits, for each non-zero significant bit i selected, i varying from 1 to N, determining its distance $P_i$ to a neighboring selected non-zero significant bit of higher rank or, for a first non-zero significant bit selected, to a decimal point, subtracting from said distance $P_i$ a minimum value of distance between two non-zero bits in any binarized number converted from any real number according to said digital representation, to obtain a modified distance, coding the modified distance $P_i$ on a predetermined number $M_i$ of bits, said convolution circuit comprising a multiplier circuit configured to calculate the result of multiplying a first number $x_i$ from the first vector with a second number $w_i$ from the second vector, the multiplier circuit comprising an adder designed to add together the first distance of the first quantized number $x_i$ and the first distance of the second quantized number $w_i$, a correspondence table indexed at least by the values of the second distance of the first quantized number $x_i$ and of the second distance of the second quantized number $w_i$ and a shift register configured to carry out a binary shift on the output of the correspondence table of a number of bits equal to the output of the adder, and the convolution circuit further comprising an accumulator configured to accumulate the output values of the multiplier circuit.

15. The computer implemented method for coding a real signal into a quantized signal of claim 1, wherein the real signal comprises at least one of the following: an image signal, a video signal, an audio signal, a radiofrequency signal, an alphanumeric signal, or a signal composed of synaptic weights of a neural network.

16. The device for coding of claim 10, wherein the real signal comprises at least one of the following: an image signal, a video signal, an audio signal, a radiofrequency signal, an alphanumeric signal, or a signal composed of synaptic weights of a neural network.

17. The computer program of claim 11, wherein the real signal comprises at least one of the following: an image signal, a video signal, an audio signal, a radiofrequency signal, an alphanumeric signal, or a signal composed of synaptic weights of a neural network.

* * * * *